United States Patent
Chen et al.

[11] Patent Number: 6,147,369
[45] Date of Patent: Nov. 14, 2000

[54] SCR AND CURRENT DIVIDER STRUCTURE OF ELECTROSTATIC DISCHARGE PROTECTIVE CIRCUIT

[75] Inventors: Wei-Fan Chen, Tai-Chung; Fu-Chien Chiu, Pan-Chyau; Ta-Lee Yu, Hsinchu Hsien, all of Taiwan

[73] Assignee: Winbond Electronics Corp., Hsinchu, Taiwan

[21] Appl. No.: 09/223,652

[22] Filed: Dec. 30, 1998

[30] Foreign Application Priority Data

Sep. 2, 1998 [TW] Taiwan ................. 87114526

[51] Int. Cl.⁷ .............. H01L 29/74; H01L 31/111; H01L 23/62; H01L 29/00
[52] U.S. Cl. ............. 257/173; 257/124; 257/126; 257/132; 257/133; 257/144; 257/152; 257/153; 257/154; 257/173; 257/355; 257/546
[58] Field of Search .................. 257/124, 126, 257/132, 133, 144, 152, 153, 154, 173, 355, 356, 546

[56] References Cited

U.S. PATENT DOCUMENTS

| | | | |
|---|---|---|---|
| 5,465,189 | 11/1995 | Polgreen et al. | 361/58 |
| 5,637,887 | 6/1997 | Consiglio | 257/109 |
| 5,895,940 | 4/1999 | Kim | 257/173 |
| 6,016,002 | 1/2000 | Chen et al. | 257/546 |

*Primary Examiner*—David Hardy
*Assistant Examiner*—Jesse A Fenty
*Attorney, Agent, or Firm*—J. C. Patents; Jiawei Huang

[57] ABSTRACT

An electrostatic discharge protective circuit of the invention includes a silicon controller rectifier (SCR) and a current diverter. The current diverter is used to bypass an initial low current thereby to prevent the SCR from being triggered by the low current. Thus, a trigger current required to activate the SCR can be greatly increased thereby to maintain an internal circuit at a normal operating state.

12 Claims, 3 Drawing Sheets

6,147,369

SCR AND CURRENT DIVIDER STRUCTURE OF ELECTROSTATIC DISCHARGE PROTECTIVE CIRCUIT

CROSS-REFERENCE TO RELATED APPLICATION

This application claims the priority benefit of Taiwan application Ser. No. 87114526, filed Sep. 2, 1998, the full disclosure of which is incorporated herein by reference.

BACKGROUND OF THE INVENTION

1. Field of the Invention

The invention relates to an electrostatic discharge protective circuit, and in particular to an electrostatic discharge protective circuit for protecting an internal circuit against damage from an electrostatic discharge by using a silicon controller rectifier (SCR).

2. Description of the Prior Art

Currently, developments of semiconductor technologies for IC manufacturing have been continuous towards miniaturization and higher integration density. As a result. ICs constituted especially by metal oxide semiconductor (MOS) transistors are more easily damaged by an electrostatic discharge (hereinafter referred to as ESD). In practice, an ESD could release several hundreds of volts or higher to cause damage on the internal circuits of ICs. Many factors could cause the ESD. One of the factors is that electrostatic charges are continuously accumulated. Therefore, how to timely release the accumulated electrostatic charges becomes a very important issue. To handle with this issue, a common prior method uses a silicon controlled rectifier (SCR) to realize the ESD protection. The detailed description of the Prior method will be given hereinafter.

Referring to FIG. 1A, an SCR, functioning an electrostatic discharge protective circuit, for an ESD protection according to the prior art is shown. In FIG. 1A, the emitter of a transistor 110 is electrically connected to an anode while the collector thereof is electrically coupled to a cathode via a resistor $R_2$. The collector of a transistor 120 is electrically coupled to the anode via a resistor $R_2$ while the emitter thereof is directly electrically connected to the cathode. Furthermore, the collector of the transistor 110 is electrically coupled to base of the transistor 120. The collector of the transistor 120 is electrically coupled to the base of the transistor 110.

A bonding pad of an IC (not shown) required to be protected against damage from an electrostatic discharge is electrically connected to the anode. Thus, electrostatic charges accumulated on the bonding pad can be bypassed via the SCR. For instant, when electrostatic charges are increasingly accumulated on the bonding pad to cause a breakdown on the transistor 110, a first current is generated and flows from the anode via the emitter and collector of the transistor 110 and the resistor R1 to the cathode. At this time, a voltage drop is created on both ends of the resistor R1 to turn on the transistor 120 due to the first current flowing through the resistor $R_1$. After the transistor 120 is turned on and operates within an active region, a second current is generated and flows from the anode via the resistor $R_2$, and the collector and emitter of the transistor 120 to the cathode. Moreover, the transistor 110 call be provided with a bias voltage created by the second current flowing through the resistor $R_2$, thereby allowing the transistor 110 to operate within an active region. Since the transistors 110 and 120 all operate within an active region, the accumulated electrostatic charges can be smoothly discharged so as to lower the voltage of the bonding pad. When the voltage of the anode (bonding pad) is insufficient to maintain the transistors 110 and 120 to operate within an active region, the transistors 110 and 120 are turned off.

Referring to FIG. 1B, there is shown an I-V cure of the SCR of FIG. 1A. In FIG. 1B, when the potential of the anode is increased to the breakdown voltage $V_t$ of the transistor 110, the transistor 110 is turned on to provide a required bias voltage to the transistor 120, thereby turning on the transistor 120. Then, the turned-on transistor 120 provides a required bias voltage to the transistor 110 to allow both transistors 110 and 120 to operate within an active region and approximately maintain the potential of the anode at a holding voltage ($V_h$).

As the SCR is turned on, the turned-on resistance and $V_h$ are very low. Therefore, an ESD protection can be perfectly realized. Unfortunately, a trigger current require by the SCR is also very low. Under this circumstance, noises can easily cause the SCR to be erroneously turned on.

SUMMARY OF THE INVENTIION

In view of the above, an object of the invention is to provide a structure of an electrostatic discharge protective circuit where a required trigger current is increased without increasing a trigger voltage. Therefore, the electrostatic discharge protective circuit cannot be erroneously triggered by noises, such that an internal circuit connected thereto can be maintained at a normal operation.

To attain the above-stated object, the electrostatic discharge protective circuit according to the invention includes a SCR and a current diverter, such as a current sinking/source. The current diverter is used to bypass an initial low current in order to prevent the SCR from being triggered. Thus, a trigger current required to activate the SCR can be greatly increased to maintain an internal circuit connected to the electrostatic discharge protective circuit at a normal operation. A method of fabricating the electrostatic discharge protective circuit includes the following steps. First, a second-type such as N-type, well is formed in a first-type, such as P-type substrate. A first second-type diffusion region, a first first-type diffusion region and a second first-type diffusion region are separated from each other and formed in the second-type well. The first second-type diffusion region and the first first-type diffusion region are electrically coupled to an anode while the second first-type diffusion region is electrically connected to a cathode. Moreover, a second second-type diffusion region and a third first-type diffusion region are formed in the first-type substrate and electrically coupled to the cathode. In addition to having a SCR structure, a by-pass transistor is included in the electrostatic discharge protective circuit. The bypass transistor is used to bypass an initial current when the SCR is turned on. The SCR formally operates after the current has greatly increased. Obviously, the electrostatic discharge protective circuit of the invention, which has a high trigger current and a two-stage turned-on characteristic, cannot be erroneously triggered by noises at all.

BRIEF DESCRIPTION OF THE DRAWINGS

The invention will be more fully understood from the detailed description given hereinbelow and the accompanying drawings, which are given by way of illustration only, and thus do not limit the present invention, and wherein.

DETAILED DESCRIPTION OF THE PREFERRED EMBODIMENTS

Figure 1A:
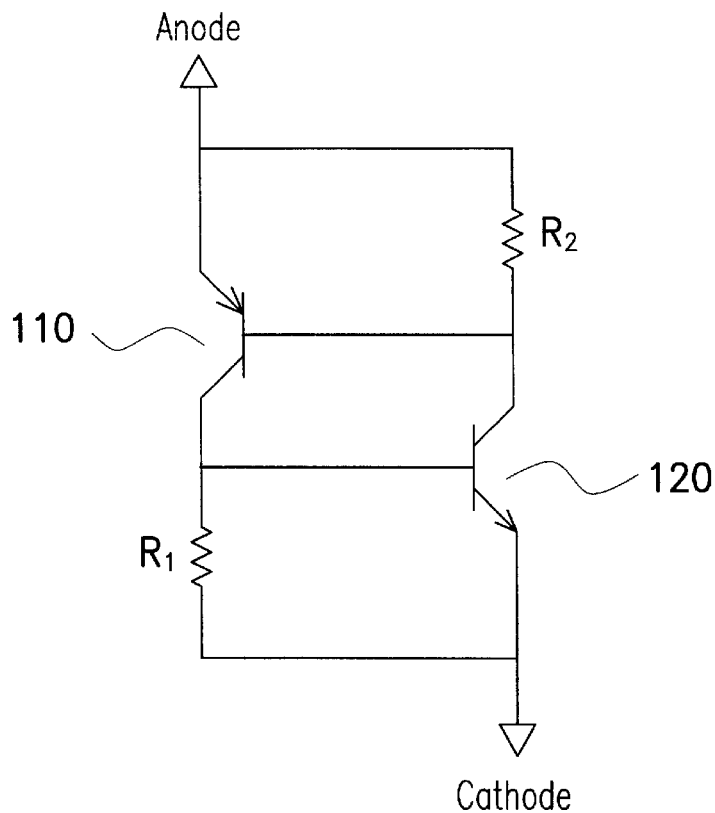
FIG. 1A is a circuit diagram showing an electrostatic discharge protective circuit according to the prior art.
Figure 1B:
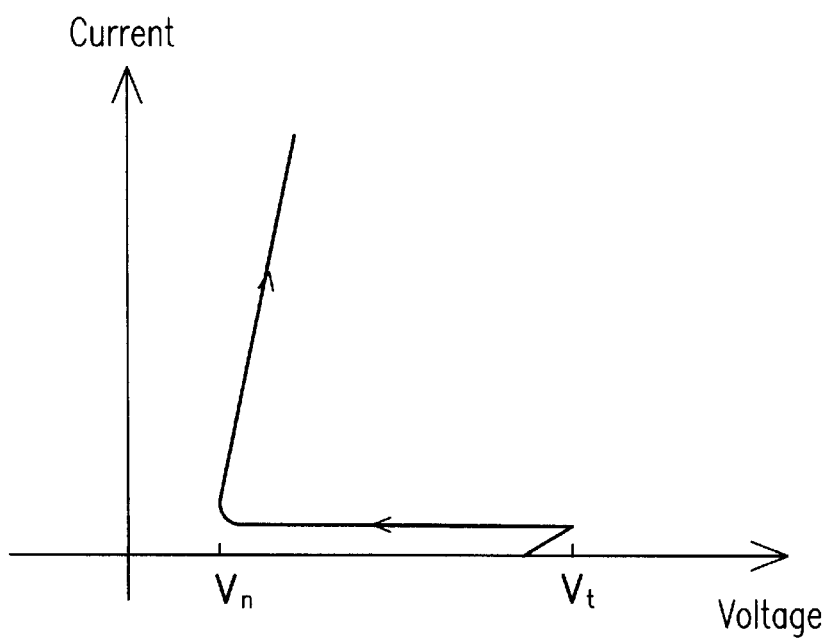
FIG. 1B is a graph showing an I-V curve of the electrostatic discharge protective circuit of FIG. 1A.
Figure 2A:
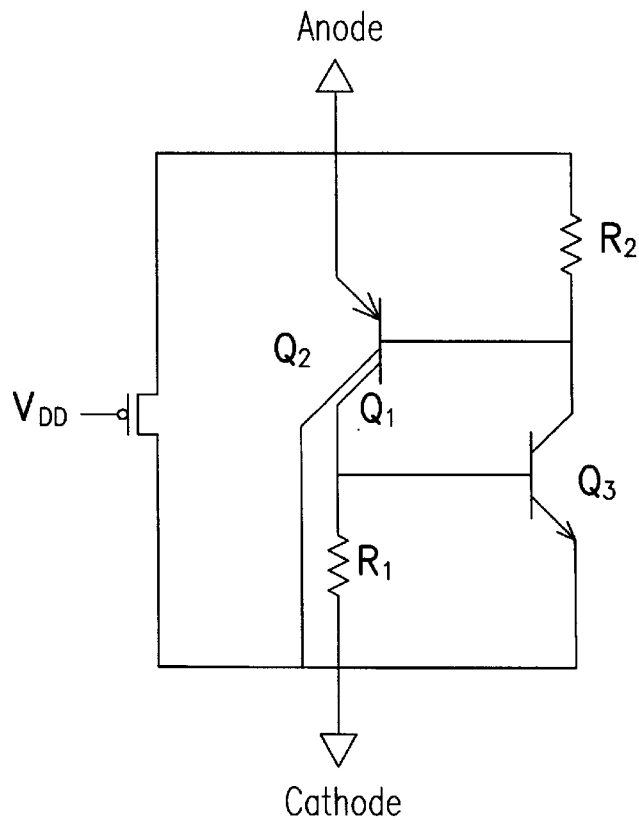
FIG. 2A is a circuit diagram showing an electrostatic discharge protective circuit according to a preferred embodiment of the invention.

FIG. 2A shows an electrostatic discharge protective circuit according to a preferred embodiment of the invention. In FIG. 2A, transistors $Q_1$ and $Q_2$ share emitter and base with each other, wherein the emitter is electrically coupled to an anode. The collector of the transistor $Q_1$ is electrically coupled to a cathode via a resistor $R_1$ while the collector of the transistor $Q_2$ is directly electrically connected to the cathode. The collector of a transistor $Q_3$ is electrically coupled to the anode via a resistor $R_2$ while the emitter thereof is directly electrically coupled to the cathode. Furthermore, the collector of the transistor $Q_1$ is electrically connected to the base of the transistor $Q_3$. The collector of the transistor $Q_3$ is electrically coupled to the base of the transistors $Q_1$ and $Q_2$. Thus, the electrostatic discharge protective circuit of the invention is completely formed.

In FIG. 2A, when the voltage of the anode is continuously increased to surpass the breakdown voltage of the transistors $Q_1$ and $Q_2$, a collector current is generated to turn the base-emitter junction of the transistors $Q_1$ and $Q_2$.

Initially, most part of the collector current directly flows to the cathode via the collector of the transistor $Q_2$ while a little part thereof flows to the cathode via the resistor R1 and the collector of the transistor $Q_1$.

When the part of the collector current flowing to the cathode via the resistor R1 is large enough to provide a bias voltage to turn on the transistor $Q_3$, the PNP-NPN positive regenerating process of the transistors $Q_1$ and $Q_3$ starts to further lower the voltage of the anode. This leads to the off-state of the transistor $Q_2$. At this time, most collector current flows to the cathode via the resistor $R_1$. The operation of the electrostatic discharge protective circuit of the invention during the off-state of the transistor $Q_2$ is similar to that of the prior art, and will not be further described here.

Figure 2B:
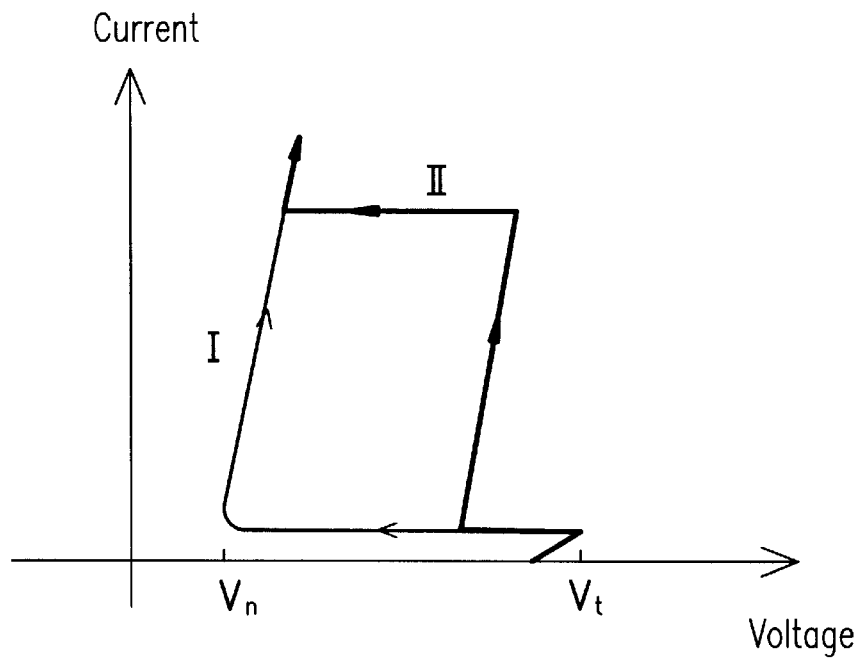
FIG. 2B is a graph showing the comparison of the I-V curves of the electrostatic discharge protective circuits of FIGS. 1A and 2A.

FIG. 2B shows the comparison of the I-V curves of the electrostatic discharge protective circuits between the invention and the prior art. In FIG. 2B, the I-V curve of the electrostatic discharge protective circuit of the invention is indicated by a path II while the IV-curve of the electrostatic discharge protective circuit of the prior art is indicated by a path I. As can be obviously known from FIG. 2B. since the electrostatic discharge protective circuit of the invention has a two-stage turned-on characteristic, a trigger current required to turn on the SCR is highly increased. Thus, noises to erroneously trigger the electrostatic discharge protective circuit is efficiently prevented.

Figure 3A:
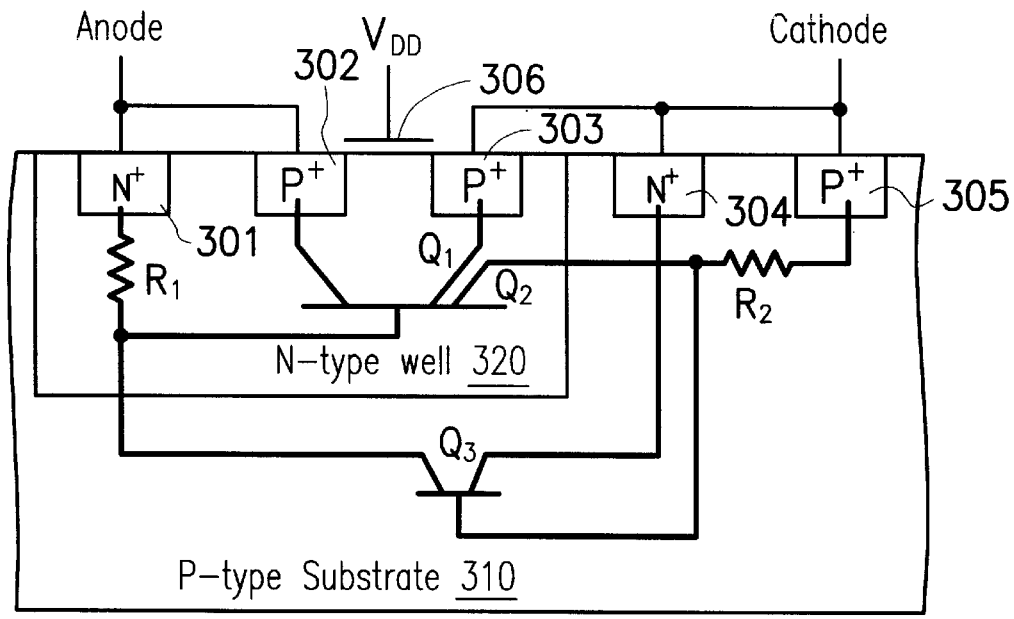
FIGS. 3A–3C. are cross-sectional views showing structures of the electrostatic discharge protective circuit of FIG. 2A.
Figure 3B:
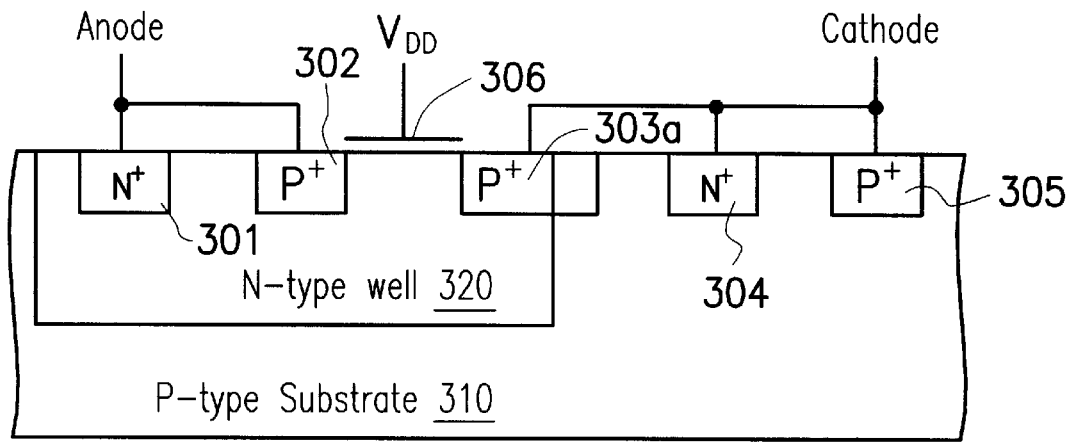
Figure 3C:
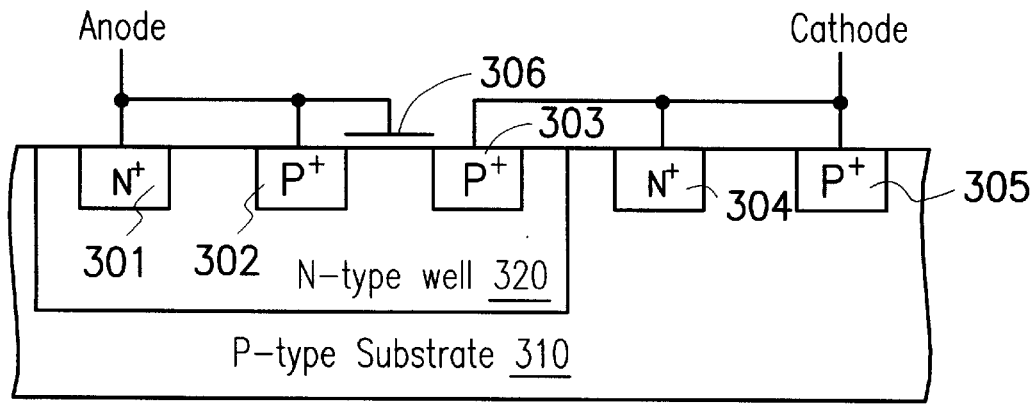

FIGS. 3A–3C are cross-sectional views showing structures of the electrostatic discharge protective circuit of FIG. 2A. In FIG. 3A, an N-type well 320 is formed in a P-type substrate 310. A first N⁺-type diffusion region 301, a first P⁺-type diffusion region 302 and a second P⁺-type diffusion region 303 are formed in the N-type well 320. A second N⁺-type diffusion region 304 and a third P⁺-type diffusion region 305 are in the P-type substrate 310. Since the first N⁺-type diffusion region 301, the first P⁺-type diffusion region 302, the second P⁺-type diffusion region 303, the second N⁺-type diffusion region 304 and the third P⁺-type diffusion region 305 are separated from each other, a number of parasitic devices are created as shown in FIG. 3A.

In addition, the first N⁺-type diffusion region and the first P⁺-type diffusion region arc electrically coupled to an anode. A gate 306 is formed between the first P⁺-type diffusion region 302 and the second P⁺-type diffusion region 303 and electrically connected to a voltage source, such as a positive voltage source $V_{DD}$. The second P⁺-type diffusion region 303, the second N⁺-type diffusion region 304 and the third P⁺-type diffusion region 305 are electrically coupled to a cathode.

FIG. 3B shows a structure of the electrostatic discharge protective circuit similar to that of FIG. 3A. The main difference is that a second P⁺-type diffusion region 303a is formed on the junction of the N-type well 320 and the P-type substrate 310. The formation and connection of parasitic devices are the same as that of FIG. 3A and will not be further described.

FIG. 3C shows a structure of the electrostatic discharge protective circuit similar to that of FIG. 3A. In FIG. 3C, the gate 306 is electrically coupled to the anode instead of to the voltage source $V_{DD}$ as stated in FIG. 3A. The formation and connection of parasitic devices are the same as that of FIG. 3A and will not be further described.

As compared to that of the prior art, the electrostatic discharge protective circuit according to the invention can increase an SCR trigger current without increasing an SCR trigger voltage. Furthermore, the electrostatic discharge protective circuit of the invention has a two-stage turned-on characteristic by which noises cannot trigger the SCR, thereby maintaining an internal circuit connected thereto at a normal operation.

Alternatively an electrostatic discharge protective circuit with the same function as described above can be fabricated in an N-type substrate instead of the P-type substrate.

While the invention has been described by way of example and in terms of the preferred embodiment, it is to be understood that the invention is not limited to the disclosed embodiment. To the contrary it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A structure of an electrostatic discharge protective circuit, comprising:

a first-type substrate;

a second-type well formed in the first-type substrate;

a first second-type diffusion region formed in the second-type well and electrically coupled to a first electrode;

a first first-type diffusion region formed in the second-type well, separated from the first second-type diffusion region and electrically coupled to the first electrode;

a second first-type diffusion region formed in the second-type well, separated from the first first-type diffusion region and electrically coupled to a second electrode;

a second second-type diffusion region formed in the first-type substrate separated from the second first-type diffusion region and electrically coupled to the second electrode;

a third first-type diffusion region formed in the first-type substrate, separated from second second-type diffusion region and electrically coupled to the second electrode.

2. The structure of claimed 1, further comprising a gate located between the first first-type diffusion region and the second first-type diffusion region and electrically coupled to a voltage source.

3. The structure of claim 2, wherein the voltage source is a positive voltage source.

4. The structure of claim 1, wherein the first electrode is an anode.

5. The structure of claim 1, wherein the second electrode is a cathode.

6. The structure of claim 1, wherein the first-type is a P-type.

7. The structure of claim 1, wherein the second-type is an N-type.

8. A structure of an electrostatic discharge protective circuit, comprising:

a first-type substrate;

a second-type well formed in the first-type substrate;

a first second-type diffusion region formed in the second-type well and electrically coupled to a first electrode, a first first-type diffusion region formed in the second-type well, separated from the first second-type diffusion region and electrically coupled to the first electrode;

a second first-type diffusion region formed in the second-type well, separated from the first first-type diffusion region and electrically coupled to a second electrode;

a gate formed between the first first-type diffusion region and the second first-type diffusion region and electrically coupled to the first electrode;

a second second-type diffusion region formed in the first-type substrate separated from the second first-type diffusion region and electrically coupled to the second electrode;

a third first-type diffusion region formed in the first-type substrate, separated from second second-type diffusion region and electrically coupled to the second electrode.

9. The structure of claim 8, wherein the first electrode is an anode.

10. The structure of claim 8, wherein the second electrode is a cathode.

11. The structure of claim 8, wherein the first-type is a P-type.

12. The structure of claim 8, wherein the second-type is an N-type.

* * * * *